(12) United States Patent
Huber

(10) Patent No.: US 10,539,643 B2
(45) Date of Patent: Jan. 21, 2020

(54) PROVING UNIT FOR USE WITH ELECTRICAL TEST TOOLS

(71) Applicant: Fluke Corporation, Everett, WA (US)

(72) Inventor: Clark N. Huber, Everett, WA (US)

(73) Assignee: FLUKE CORPORATION, Everett, WA (US)

( * ) Notice: Subject to any disclaimer, the term of this patent is extended or adjusted under 35 U.S.C. 154(b) by 182 days.

(21) Appl. No.: 15/694,456

(22) Filed: Sep. 1, 2017

(65) Prior Publication Data
US 2019/0072632 A1 Mar. 7, 2019

(51) Int. Cl.
G01R 35/00 (2006.01)
G01R 19/22 (2006.01)

(52) U.S. Cl.
CPC ............ G01R 35/00 (2013.01); G01R 19/22 (2013.01)

(58) Field of Classification Search
CPC ........ G01R 35/00; G01R 35/005; G01R 1/22; G01R 15/144; G01R 19/00; G01R 19/0084; G01R 19/18; G01R 19/22; G01R 31/08
See application file for complete search history.

(56) References Cited

U.S. PATENT DOCUMENTS 4,580,188 A 4/1986 Brown et al.
5,291,124 A 3/1994 Hoffman et al.
5,473,244 A 12/1995 Libove et al.
5,583,444 A 12/1996 Nakamura et al.
5,973,501 A 10/1999 Reichard
(Continued)

FOREIGN PATENT DOCUMENTS

CN 2639905 Y 9/2004
EP 0 366 360 A1 5/1990
(Continued)

OTHER PUBLICATIONS

Calmet Ltd., "Multifunction Calibrator of alternating and direct voltage current," downloaded on Feb. 7, 2018 from http://www.calmet.com.pl/images/pdf/C101F%20data%20sheet.pdf, 2012, 2 pages.
(Continued)

Primary Examiner — David M. Gray
Assistant Examiner — Michael A Harrison
(74) Attorney, Agent, or Firm — Seed Intellectual Property Law Group LLP

(57) ABSTRACT

Systems and methods that provide a portable, verified voltage source that allows safe testing of separate contact and non-contact voltage measurement devices. A proving unit of the present disclosure selectively provides a known or specified direct current (DC) voltage, a contact alternating current (AC) voltage, and a non-contact AC voltage, which voltages may be fixed or may be user-selectable. The proving unit may include a visual indicator and/or an audible indicator that provides the user with an indication confirming that the proving unit is supplying the selected output voltage within the specifications of the proving unit, so the user will know that the proving unit is operating normally and is ready for testing the operation of a contact or non-contact voltage measurement device. If the proving unit cannot provide the specified voltage output, the indicator(s) provides a signal to the user that the proving unit is currently non-functional.

22 Claims, 7 Drawing Sheets

(56) References Cited

U.S. PATENT DOCUMENTS

| | | | |
|---|---|---|---|
| 6,014,027 | A | 1/2000 | Reichard |
| 6,118,270 | A | 9/2000 | Singer et al. |
| 6,351,399 | B2 | 2/2002 | Takanashi et al. |
| 6,664,708 | B2 | 12/2003 | Schlimak et al. |
| 6,812,685 | B2 | 11/2004 | Steber et al. |
| 6,825,649 | B2 | 11/2004 | Nakano |
| 7,084,643 | B2 | 8/2006 | Howard et al. |
| 7,466,145 | B2 | 12/2008 | Yanagisawa |
| 8,054,061 | B2 | 11/2011 | Prance et al. |
| 8,222,886 | B2 | 7/2012 | Yanagisawa |
| 8,410,883 | B2 | 4/2013 | Asplund et al. |
| 8,680,845 | B2 | 3/2014 | Carpenter et al. |
| 8,803,506 | B2 | 8/2014 | Yanagisawa |
| 9,063,184 | B2 | 6/2015 | Carpenter et al. |
| 9,201,100 | B2 | 12/2015 | Yanagisawa |
| 10,119,998 | B2 | 11/2018 | Ringsrud et al. |
| 2002/0167303 | A1 | 11/2002 | Nakano |
| 2004/0073146 | A1 | 4/2004 | Weintraub et al. |
| 2004/0143994 | A1 | 7/2004 | Baron et al. |
| 2006/0133798 | A1 | 6/2006 | Palmer et al. |
| 2008/0136422 | A1 | 6/2008 | Clarridge et al. |
| 2010/0090682 | A1 | 4/2010 | Armstrong |
| 2010/0283539 | A1 | 11/2010 | Yanagisawa |
| 2011/0276300 | A1 | 11/2011 | Gallavan |
| 2016/0109486 | A1 | 4/2016 | Yanagisawa |
| 2016/0204646 | A1 | 7/2016 | Park et al. |
| 2018/0136303 | A1* | 5/2018 | Epperson ............... G01R 1/22 |

FOREIGN PATENT DOCUMENTS

| | | |
|---|---|---|
| EP | 0 913 695 A2 | 5/1999 |
| EP | 1 249 706 B1 | 9/2007 |
| EP | 3 321 701 A1 | 5/2018 |
| JP | 2006-242855 A | 9/2006 |
| JP | 2007-163414 A | 6/2007 |
| JP | 2007-163415 A | 6/2007 |
| JP | 2007-212204 A | 8/2007 |
| JP | 2007-256141 A | 10/2007 |
| JP | 2008-2925 A | 1/2008 |
| JP | 2008-14644 A | 1/2008 |
| JP | 2008-14645 A | 1/2008 |
| JP | 2008-20270 A | 1/2008 |
| JP | 2008-261646 A | 10/2008 |
| JP | 2008-261783 A | 10/2008 |
| JP | 2008-261785 A | 10/2008 |
| JP | 2009-168696 A | 7/2009 |
| JP | 2010-25778 A | 2/2010 |
| JP | 2010-286347 A | 12/2010 |
| JP | 2011-122860 A | 6/2011 |
| JP | 2012-47677 A | 3/2012 |
| JP | 2014-44168 A | 3/2014 |
| JP | 2014-44169 A | 3/2014 |
| JP | 2015-111087 A | 6/2015 |
| JP | 2016-3997 A | 1/2016 |

OTHER PUBLICATIONS

Fluke Corporation, "The 5700A/5720A Series II High Performance Multifunction Calibrators Extended Specifications," downloaded on Feb. 7, 2018 from http://download.flukecal.com/pub/literature/1268275Gw.pdf, 2012, 27 pages.

Fluke Corporation, "Clamp Meter Service Information," downloaded on Feb. 7, 2018 from http://www.industrialcalibration.co.uk/downloads/Fluke%2030%20Clamp%20Meter%20Service%20Date.pdf, 1998, 4 pages.

Galliana et al., "Traceable Technique to Calibrate Clamp Meters in AC Current From 100 to 1500 A," *IEEE Transactions on Instrumentation and Measurement* 61(9):2512-2518, 2012.

Extended European Search Report, dated Feb. 11, 2019, for European Application No. 18190649.6—1022, 20 pages.

Hioki, "3258 : Safety HiTESTER," Revised Edition 5, Hioki E. E. Corporation, Nagano Japan, 2 pages.

Mitchell Instrument Company Inc., clipping from the Mitchell Catalogue, undated, 1 page.

Takahashi, "Clamp on Power Logger PW3365 : Safety Voltage Sensor PW9020," *HIOKI Technical Notes* 1(1): 2015, 8 pages.

Tsang et al., "Dual capacitive sensors for non-contact AC voltage measurement," *Sensors and Actuators A* 167:261-266, 2011.

* cited by examiner

PROVING UNIT FOR USE WITH ELECTRICAL TEST TOOLS

BACKGROUND

Technical Field

The present disclosure generally relates to measurement of electrical characteristics, and more particularly, to proving units for contact and non-contact measurement of alternating current (AC) and/or direct current (DC) voltage.

Description of the Related Art

Voltmeters are instruments used for measuring voltage in an electric circuit. Instruments which measure more than one electrical characteristic are referred to as multimeters or digital multimeters (DMMs), and operate to measure a number of parameters generally needed for service, troubleshooting, and maintenance applications. Such parameters typically include alternating current (AC) voltage and current, direct current (DC) voltage and current, and resistance or continuity. Other parameters, such as power characteristics, frequency, capacitance, and temperature, may also be measured to meet the requirements of the particular application.

With conventional voltmeters or multimeters which measure AC voltage, it is necessary to bring two measurement electrodes or probes into galvanic contact with a conductor, which often requires cutting away part of the insulation of an insulated electrical wire, or providing terminals for measurement in advance. A "non-contact" voltage measurement device may be used to detect voltage (e.g., AC voltage) without requiring galvanic contact with the circuit.

BRIEF SUMMARY

A proving unit to verify the operation of a separate voltage measurement device may be summarized as including a housing; an alternating current (AC) voltage source that, in operation, provides an AC voltage at an AC output node; a contact AC/DC positive port that is accessible to a test instrument probe of a separate contact voltage measurement device; AC-to-DC converter circuitry that, in operation, receives an AC voltage as input and outputs a DC voltage; at least one AC/DC switch that, in operation, selectively electrically couples the AC output node of the AC voltage source either directly to the contact AC/DC positive port, or indirectly to the contact AC/DC positive port via the AC-to-DC converter circuitry; a field sense conductor disposed within the housing at a sensor receiving portion of the housing, wherein the field sense conductor is electrically coupled to the AC output node; a mode selection switch; and a controller operatively coupled to the mode selection switch, the AC voltage source, and the at least one AC/DC switch, wherein, in operation, the controller: receives, via the mode selection switch, a selection of a mode of operation, the mode of operation comprising at least a DC voltage mode or an AC voltage mode; controls the at least one AC/DC switch based at least in part on the received selection of the mode of operation; and causes the AC voltage source to provide an AC voltage at the AC output node. The sensor receiving portion may include a central raised portion that contains at least a portion of the field sense conductor, and the central raised portion may be sized and dimensioned to receive a probe end of a non-contact voltage measurement device. The AC voltage source may include a digital-to-analog converter, an amplifier, and a transformer, wherein an output of the digital-to-analog converter is coupled to an input of the amplifier, an output of the amplifier is coupled to an input of the transformer, and the AC output node comprises an output of the transformer.

The proving unit may further include an ON switch operatively coupled to the controller, wherein, in operation, the ON switch is activated responsive to an operator interacting with a port of the proving unit, and the controller causes the AC voltage source to provide the AC voltage for a determined period of time after the ON switch is activated.

The proving unit may further include a field sense finger port electrically coupled to a reference node of the proving unit, wherein the field sense finger port is accessible to a finger of an operator of a separate non-contact voltage measurement device that is being verified by the proving unit while the operator is grasping the non-contact voltage measurement device.

The proving unit may further include a plurality of ON switches operatively coupled to the controller, each of the ON switches associated with a different port of the proving unit, wherein, in operation, each of the ON switches is activated responsive to an operator interacting with one of the respective ports of the proving unit, and the controller causes the AC voltage source to provide the AC voltage for a determined period of time after activation of any of the ON switches.

The proving unit may further include a field sense probe port electrically coupled to a reference node of the proving unit, wherein the field sense probe port is accessible to a test instrument probe of a separate non-contact voltage measurement device that is being verified by the proving unit.

The proving unit may further include a plurality of ON switches operatively coupled to the controller, each of the ON switches associated with a different port of the proving unit, wherein, in operation, each of the ON switches is activated responsive to an operator interacting with one of the respective ports of the proving unit, and the controller causes the AC voltage source to provide the AC voltage for a determined period of time after activation of any of the ON switches. The at least one AC/DC switch may include a first AC/DC switch coupled to an input of the AC-to-DC converter circuitry and a second AC/DC switch coupled to an output of the AC-to-DC converter circuitry.

The proving unit may further include an indicator coupled to the controller, wherein, in operation, the controller controls the indicator to provide an indication of an operational status of the proving unit. The indicator may include a plurality of light emitting diodes (LEDs).

The proving unit may further include feedback circuitry operatively coupled to the AC output node and the controller, wherein, in operation, the controller receives a feedback signal from the feedback circuitry and controls the operation of the AC voltage source based at least in part on the received feedback signal. The AC-to-DC converter circuitry may include at least one rectifying diode and at least one filter capacitor. Upon receiving a selection of an AC voltage mode, the controller may control the at least one AC/DC switch to electrically couple the AC output node of the AC voltage source directly to the contact AC/DC positive port and, upon receiving a selection of a DC voltage mode, the controller may control the at least one AC/DC switch to electrically couple the AC output node of the AC voltage source indirectly to the contact AC/DC positive port via the AC-to-DC converter circuitry.

A proving unit to verify the operation of a separate voltage measurement device may be summarized as including an alternating current (AC) voltage source that, in operation, provides an AC voltage at an AC output node; a contact AC/DC positive port; AC-to-DC converter circuitry that, in operation, receives an AC voltage as input and outputs a DC voltage; at least one AC/DC switch that, in operation, selectively electrically couples the AC-to-DC converter circuitry between the AC output node and the contact AC/DC positive port; a field sense conductor electrically coupled to the AC output node; a mode selection switch; and control circuitry operatively coupled to the mode selection switch, the AC voltage source, and the at least one AC/DC switch, wherein, in operation, the control circuitry: receives, via the mode selection switch, a selection of a mode of operation, the mode of operation comprising at least a DC voltage mode or an AC voltage mode; controls the at least one AC/DC switch based at least in part on the received selection of a mode of operation; and causes the AC voltage source to provide an AC voltage at the AC output node. The control circuitry may cause the AC voltage source to provide an AC voltage at the AC output node for a period of time after user interaction with a port of the proving unit is detected. The period of time may be between 10 seconds and 60 seconds. The AC voltage source may include a digital-to-analog converter, an amplifier, and a transformer, wherein an output of the digital-to-analog converter is coupled to an input of the amplifier, an output of the amplifier is coupled to an input of the transformer, and the AC output node comprises an output of the transformer.

The proving unit may further include a field sense finger port electrically coupled to a reference node of the proving unit, wherein the field sense finger port is accessible to a finger of an operator of a separate non-contact voltage measurement device while grasping the non-contact voltage measurement device; and a field sense probe port electrically coupled to a reference node of the proving unit, wherein the field sense probe port is accessible to a test instrument probe of a separate non-contact voltage measurement device.

The proving unit may further include an indicator coupled to the control circuitry, wherein, in operation, the control circuitry controls the indicator to provide an indication of an operational status of the proving unit.

A kit may be summarized as including a voltage measurement device; and a proving unit to verify the operation of the voltage measurement device, the proving unit comprising: a housing; an alternating current (AC) voltage source that, in operation, provides an AC voltage at an AC output node; a contact AC/DC positive port that is accessible to a test instrument probe of a separate contact voltage measurement device; AC-to-DC converter circuitry that, in operation, receives an AC voltage as input and outputs a DC voltage; at least one AC/DC switch that, in operation, selectively electrically couples the AC output node of the AC voltage source either directly to the contact AC/DC positive port, or indirectly to the contact AC/DC positive port via the AC-to-DC converter circuitry; a field sense conductor disposed within the housing at a sensor receiving portion of the housing, the sensor receiving portion configured and arranged to receive at least a portion of the voltage measurement device, the field sense conductor electrically coupled to the AC output node; a mode selection switch; and a controller operatively coupled to the mode selection switch, the AC voltage source, and the at least one AC/DC switch, wherein, in operation, the controller: receives, via the mode selection switch, a selection of a mode of operation, the mode of operation comprising at least a DC voltage mode or an AC voltage mode; controls the at least one AC/DC switch based at least in part on the received selection of the mode of operation; and causes the AC voltage source to provide an AC voltage at the AC output node. The voltage measurement device may include at least one of a contact voltage measurement device or a non-contact voltage measurement device capable of measuring voltage in an insulated wire without galvanically contacting a conductor in the insulated wire.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn, are not necessarily intended to convey any information regarding the actual shape of the particular elements, and may have been solely selected for ease of recognition in the drawings.

DETAILED DESCRIPTION

Figure 1A:
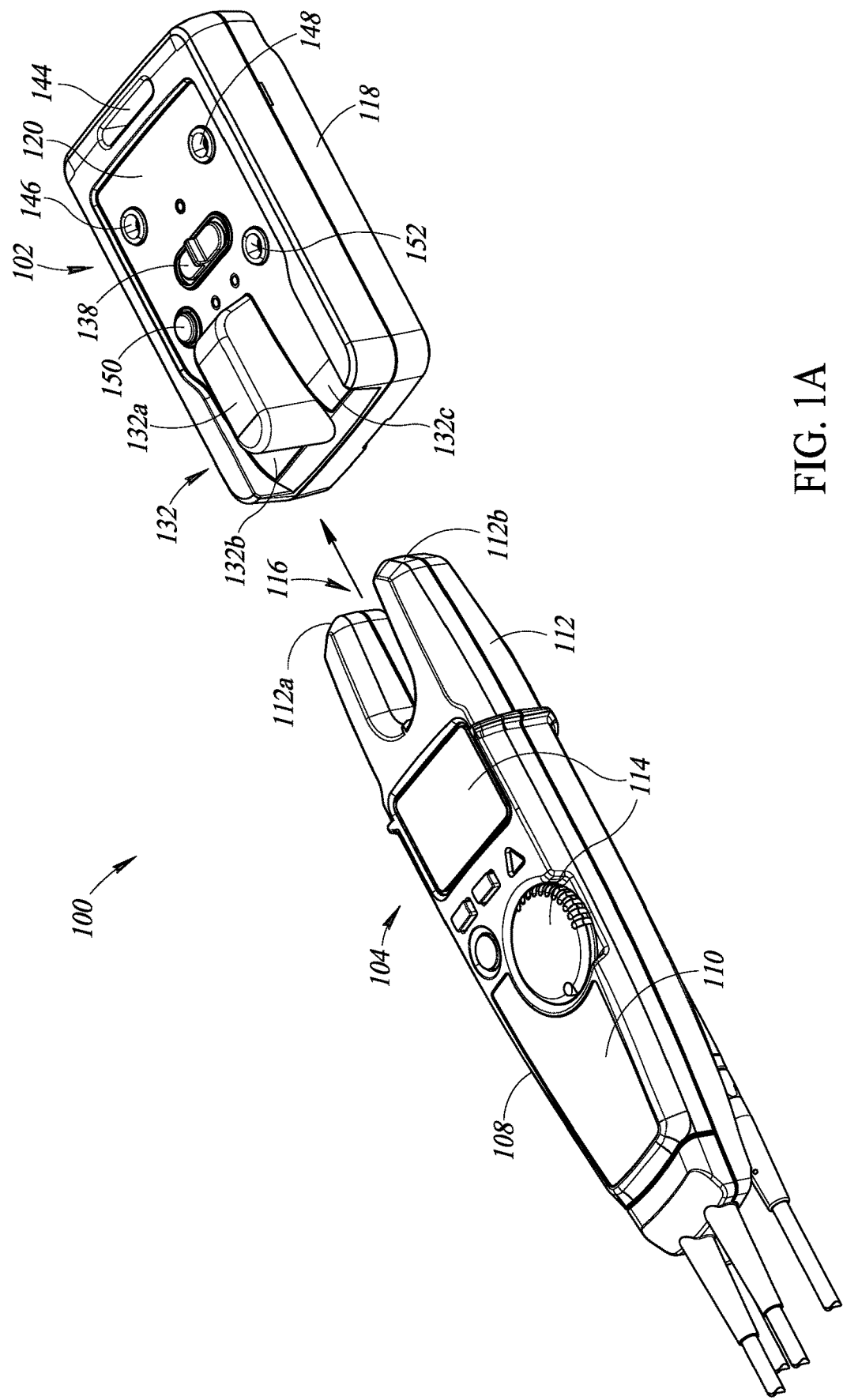
FIG. 1A is a perspective view of a voltage measurement device proving unit according to one illustrated implementation, showing a non-contact voltage measurement device that is to be verified when positioned beside the proving unit.

Recently, in addition to conventional contact voltage measurement devices (e.g., DMMs), AC voltage measurement devices that provide convenient and accurate voltage measurements without requiring galvanic contact with the circuit being tested have been developed. Such devices may be referred to herein as field sense non-contact, or simply "non-contact," devices. In some applications, technicians using voltage measurement devices may be in areas where no known sources of voltage can be found to verify the operation of the voltage measurement devices. For example, a technician may be in a tower of a wind generator or at a remote pumping site where power has to be shut off or has gone off-line due to weather or other causes. In some applications, there may be a need or requirement to verify or prove the operation of a voltage measurement device on a known voltage source before, and possibly after, a test of a circuit is performed.

Implementations of the present disclosure advantageously provide portable voltage measurement device proving units, or "proving units," which may be used by technicians in situations where there are no known voltage sources or all known voltage sources are de-energized. In at least some implementations, the proving units provide functionality for proving AC and/or DC contact voltage measurement devices (e.g., conventional DMMs) as well as functionality for proving non-contact or "field sense" voltage measurement devices. In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with computer systems, server computers, and/or communications networks have not been shown or described in detail to avoid unnecessarily obscuring descriptions of the implementations.

Unless the context requires otherwise, throughout the specification and claims that follow, the word "comprising" is synonymous with "including," and is inclusive or open-ended (i.e., does not exclude additional, unrecited elements or method acts).

Reference throughout this specification to "one implementation" or "an implementation" means that a particular feature, structure or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

The headings and Abstract of the Disclosure provided herein are for convenience only and do not interpret the scope or meaning of the implementations.

As discussed further below, at least some of the implementations of the proving units discussed herein provide a portable, verified voltage source that allows safe testing of contact and non-contact voltage measurement devices. A proving unit of the present disclosure may provide a verified AC voltage output (e.g., 100 VAC, 120 VAC, 240 VAC, 250 VAC) or DC voltage output (e.g., 100 VDC, 120 VDC, 240 VDC, 250 VDC) which may be fixed or may be user-selectable through a suitable user interface (e.g., switch, dial, touchscreen). In at least some implementations, a proving unit is operative to generate a fixed AC voltage (e.g., 240 VAC) and a fixed DC voltage (e.g., 240 VDC). The proving unit may include a visual indicator (e.g., light emitting diodes (LEDs), display) and/or an audible or haptic indicator (e.g., speaker, buzzer, vibration device) that provides the user with an indication that the proving unit is in fact supplying an output voltage within the specifications of the proving unit, so the user will know that the proving unit is operating normally and is ready for testing voltage measurement devices. In this example, if the proving unit cannot provide the specified voltage output for whatever reason (e.g., low battery), the indicator(s) provides a signal to the user that the proving unit is currently non-functional.

Figure 1B:
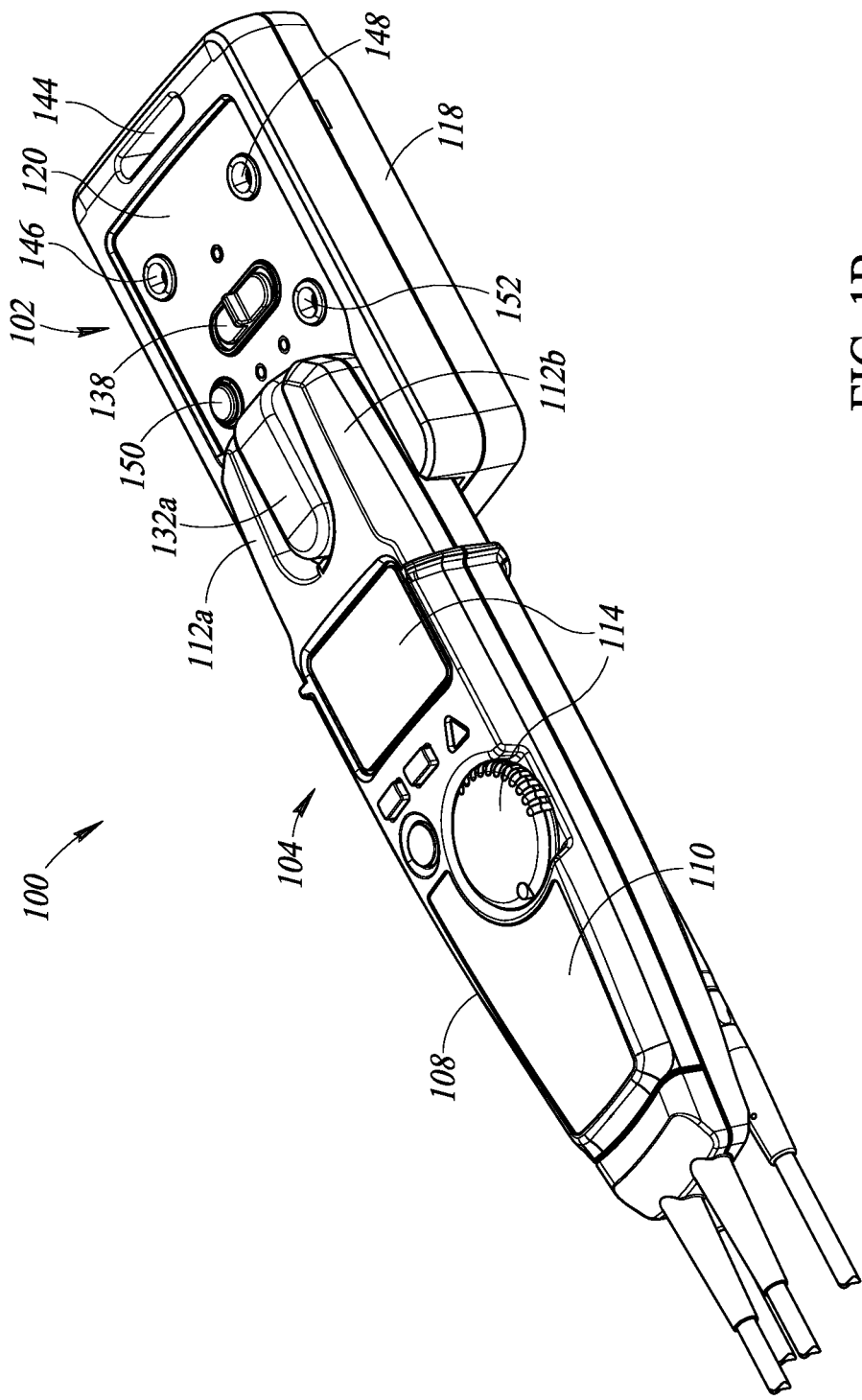
FIG. 1B is a perspective view of the voltage measurement device proving unit, showing a forked front end of the non-contact voltage measurement device positioned at a sensor receiving portion of the proving unit.

FIGS. 1A-1B show an environment 100 in which a voltage measurement device proving unit 102 may be used to verify or prove the operation of a non-contact voltage measurement device 104 without requiring galvanic contact between the non-contact voltage measurement device and the proving unit. FIGS. 2-6 show various views of the voltage measurement device proving unit or system 102, which may be used to verify the operation of both contact and non-contact voltage measurement devices.

The non-contact voltage measurement device 104 includes a housing or body 108 that includes a grip portion or end 110 and a probe portion or end 112, also referred to herein as a front end, opposite the grip portion. The housing 108 may also include a user interface 114 which facilitates user interaction with the non-contact voltage measurement device 104. The user interface 114 may include any number of inputs (e.g., buttons, dials, switches, touch sensor) and any number of outputs (e.g., display, LEDs, speakers, buzzers). The non-contact voltage measurement device 104 may also include one or more wired and/or wireless communications interfaces (e.g., USB, Wi-Fi®, Bluetooth®).

In at least some implementations, the probe portion 112 may include a recessed portion 116 that receives an insulated wire under test. The recessed portion 116 may be defined by a slot between two spaced apart prongs 112a and 112b of the front end. The prongs 112a and 112b of the front end 112 may be referred to herein as a "fork" of the voltage measurement device 104. The probe portion 112 may include a sensor or electrode which rests proximate the insulated wire when the insulated wire is positioned within the recessed portion 116 of the non-contact voltage measurement device 104. Although not shown for clarity, the sensor may be disposed inside of the housing 108 to prevent physical and electrical contact between the sensor and other objects.

In normal use of the voltage measurement device 104, an operator may grasp the grip portion 110 of the housing 108 and place the probe portion 112 proximate an insulated wire under test so that the non-contact voltage measurement device 104 may accurately measure the AC voltage present in the wire with respect to earth ground (or another reference node). Although the probe end 112 is shown as having the recessed portion 116, in other implementations the probe portion 112 may be configured differently. For example, in at least some implementations, the probe portion 112 may include a selectively movable clamp, a hook, a flat or arcuate surface which includes the sensor, or other type of interface which allows a sensor of the non-contact voltage measurement device 104 to be positioned proximate the insulated wire under test.

In at least some implementations, the operator's body may act as a reference to earth/ground. The measurement functionality discussed herein is not limited to applications only measuring relative to earth. The outside reference may be capacitively coupled to any other potential. For example, if the outside reference is capacitively coupled to another phase in three phase systems, the phase-to-phase voltages are measured.

As discussed further below, in at least some implementations, the non-contact voltage measurement device 104 may utilize the body capacitance between the operator and ground during the AC voltage measurement. In at least some implementations, the non-contact voltage measurement device 104 may include a test lead or probe that is couple-able to a reference node during measurement of an AC voltage in an insulated conductor.

The proving unit 102 includes a housing or body 118 which, in the illustrated embodiment, has a generally cuboid shape with a top surface 120, a bottom surface 122 (FIG. 3) opposite the top surface, a front sidewall 124, a rear sidewall 126 opposite the front sidewall, a left lateral sidewall 128

(FIG. 3) and a right lateral sidewall 130 (FIG. 2) opposite the left lateral sidewall. In other implementations, the proving unit 102 may have a housing or body of a different shape.

Figure 2:
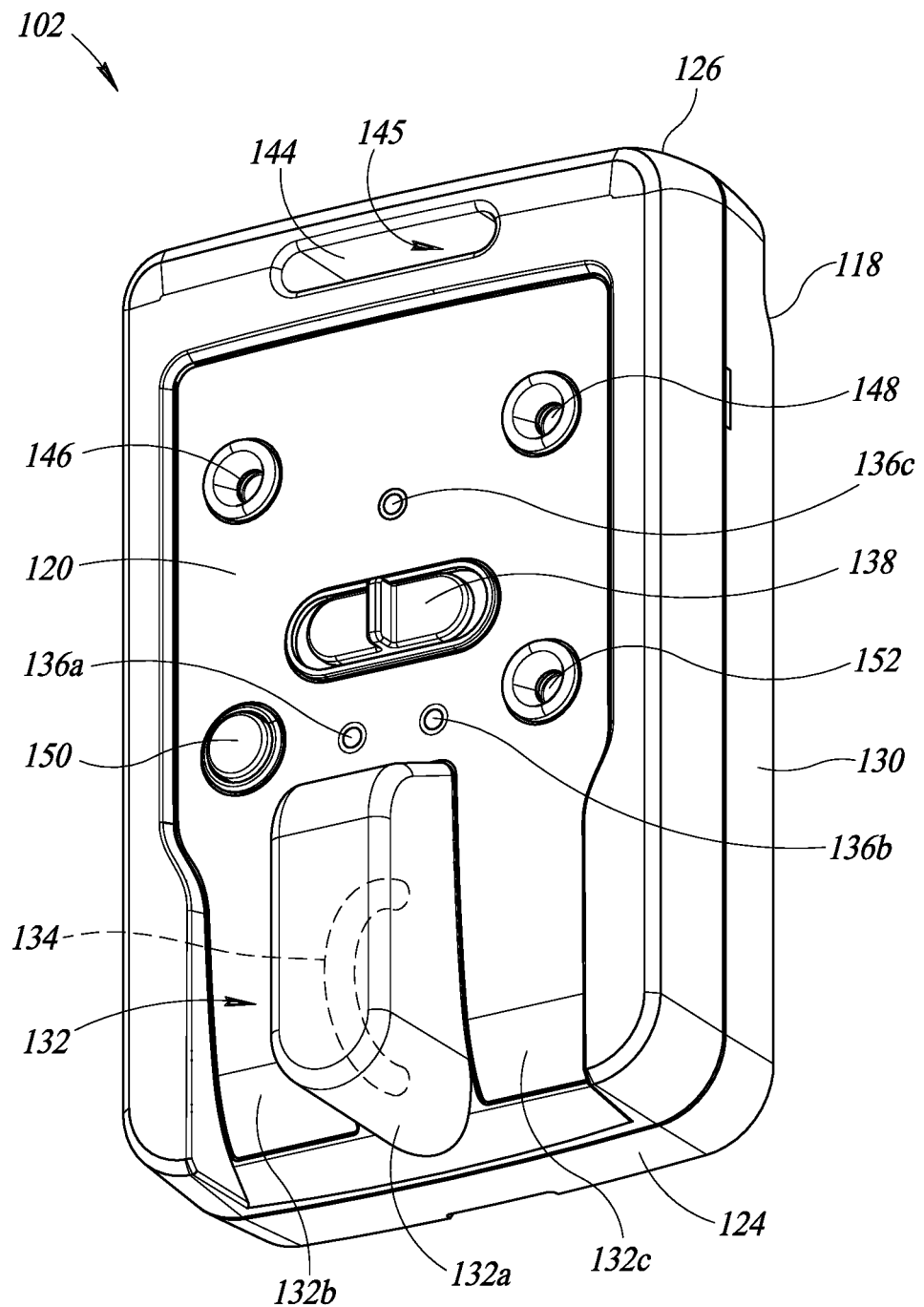
FIG. 2 is a perspective view of the voltage measurement device proving unit, showing a top portion thereof.
Figure 6:
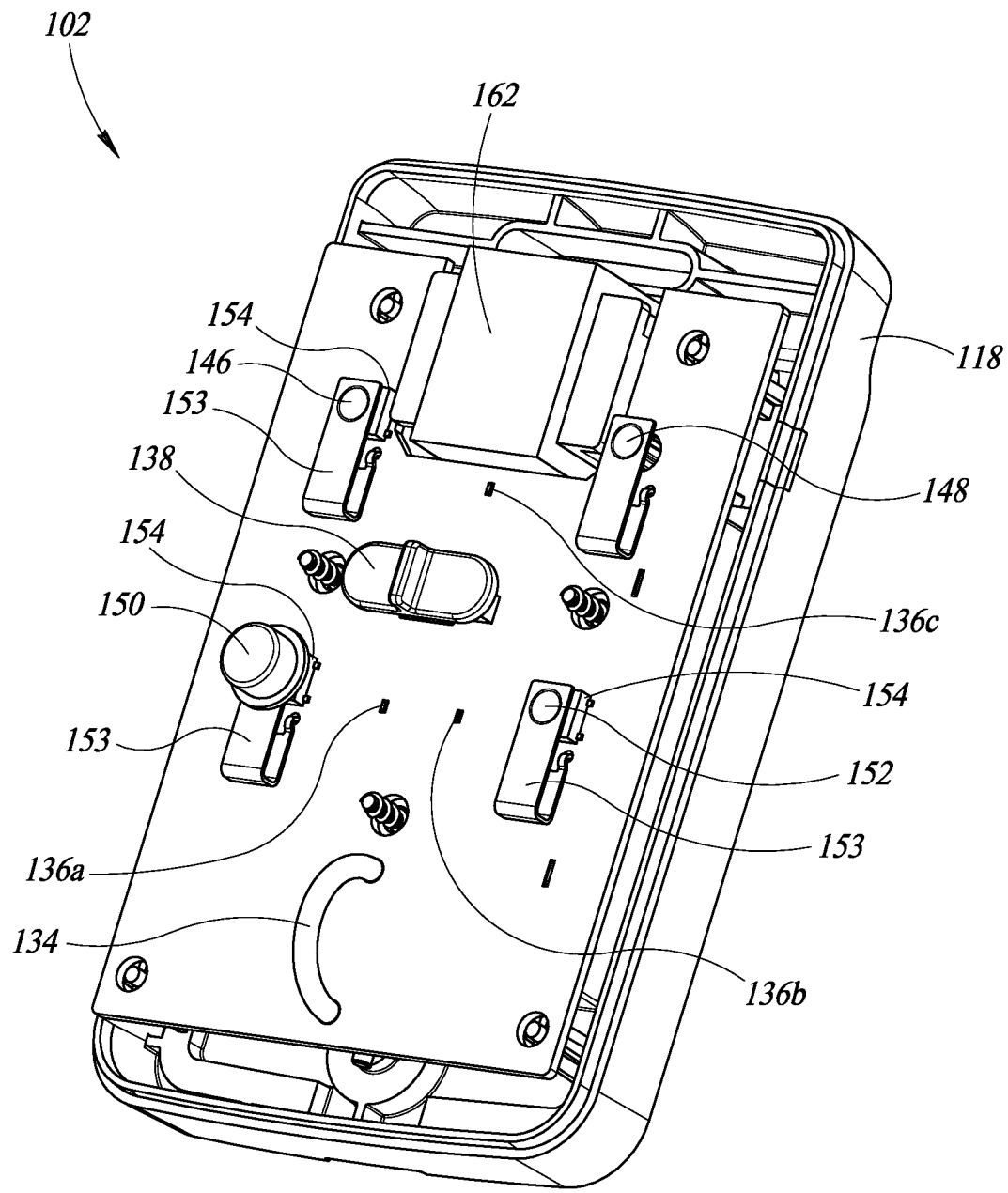
FIG. 6 is a perspective view of the voltage measurement device proving unit, shown with a front portion of a housing removed to illustrate various internal components of the proving unit.

On the top surface 120 of the housing 118 toward the bottom surface 122 there is a sensor receiving portion 132 that receives the front end 112 of the voltage measurement device 104 during a proving operation. The sensor receiving portion 132 includes a central raised portion 132a and lateral lower portions 132b and 132c disposed on left and right sides, respectively, of the central raised portion. As shown in FIGS. 2 and 6, the central raised portion 132a defines an interior volume in which a field sense conductor 134 is positioned. As shown best in FIG. 1B, the sensor receiving portion 132 is sized and dimensioned to receive the fork-shaped front end 112 of the voltage measurement device 104, with the prongs 112a and 112b resting on the lateral lower portions 132b and 132c, respectively, and the central raised portion 132a containing the field sense conductor 134 positioned in the recessed portion 116 of the front end 112. As discussed further below, the proving unit 102 is operative to generate an AC voltage in the field sense conductor 134, which AC voltage the voltage measurement device 104 is operative to measure without galvanic contact when the front end 112 is positioned at the sensor receiving portion 132 of the proving unit as shown in FIG. 1B. The field sense conductor 134 may be any suitable conductor, such as a wire, stamped piece of metal, etc. In at least some implementations, the field sense conductor 134 may comprise a stamped piece of metal that is sized and dimensioned to conform to an inside surface of the sensor receiving portion 132. Such shape and size may provide better coupling with the sensor of the non-contact voltage measurement device compared to a single wire.

The top surface 120 or other surface of the housing 118 may include a user interface which includes one or more inputs (e.g., buttons, dials, touchscreen) that allows users to input control functions (e.g., select operational mode, select voltage level, select frequency) and/or one or more outputs (e.g., light (e.g., LED), display, speaker, buzzer) that provides indications (e.g., operational status) to the user. In the illustrated implementation, the user interface comprises three LEDs 136a, 136b, and 136c (collectively, LEDs 136) and a mode selection switch 138. Although the user interface is shown on the top surface 120 in the illustrated implementation, it should be appreciated that the user interface may be disposed on one or more of any of the outer surfaces of the housing 118. A suitable user interface may additionally or alternatively be provided on a separate device (e.g., smartphone, tablet computer, laptop computer, etc.) that communicates via wired or wireless transmission with the proving unit 102.

Figure 3:
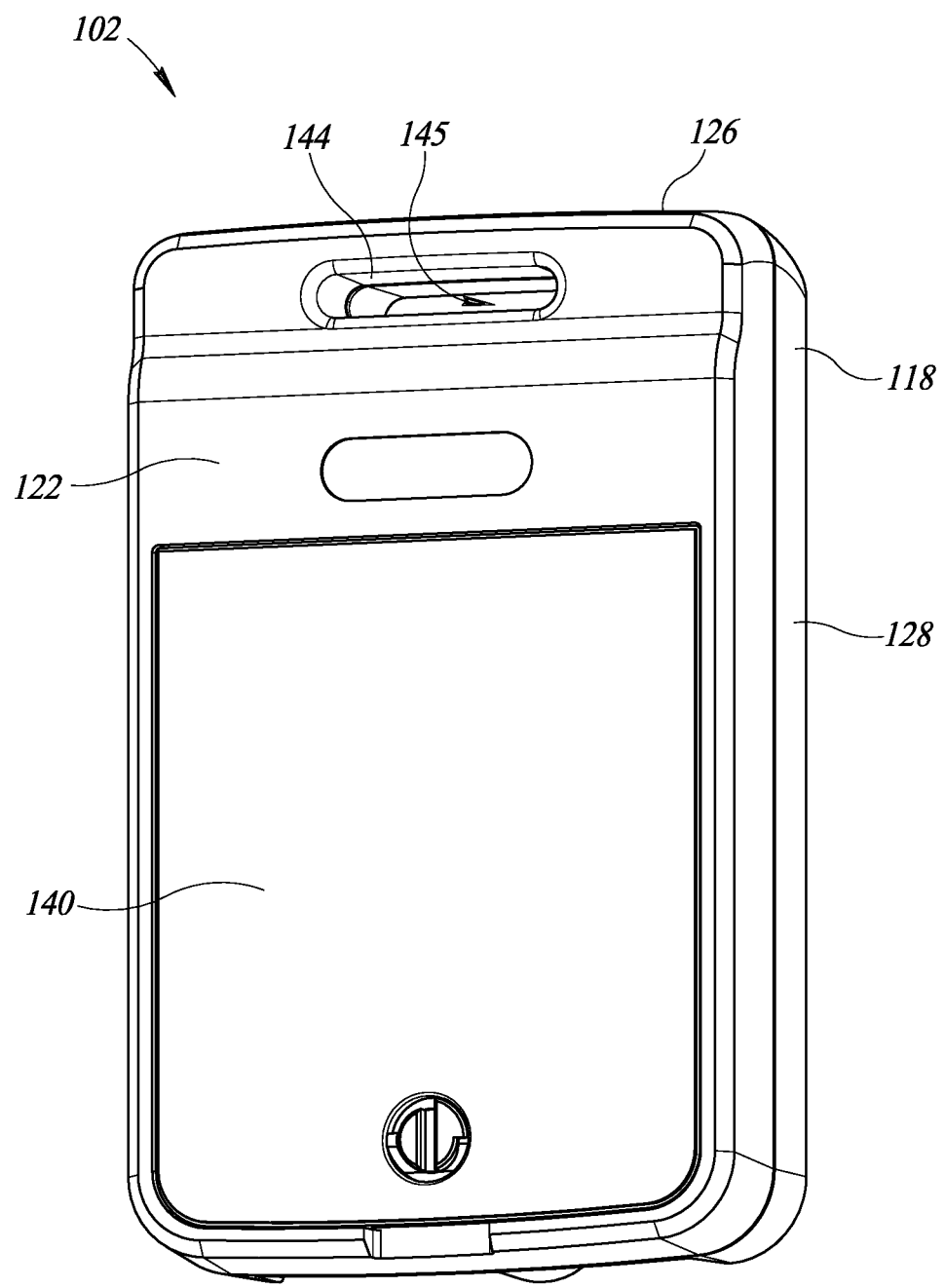
FIG. 3 is a perspective view of the voltage measurement device proving unit, showing a bottom portion thereof.

As shown in FIG. 3, the housing 118 may also include a selectively removable battery door 140 which provides access to a battery compartment inside the housing that selectively receives one or more batteries 142 (FIG. 5) therein. In at least some implementations, the one or more batteries 142 include 4 AA batteries, although other numbers and types of batteries may also be used. In other implementations, the housing 118 may include a battery compartment that permanently receives one or more batteries therein, such as one or more rechargeable batteries.

Proximate the rear sidewall 126 of the proving unit 102, there is an attachment point or strap mount portion 144 that defines an aperture 145 which extends through the housing 118 between the top surface 120 and the bottom surface 122. The aperture 145 defined by the strap mount portion 144 may removably receive a strap therethrough. The strap may be attached to a fixture (e.g., equipment, rack) such that the proving unit 102 hangs from the fixture, which allows the user to utilize the proving unit without having to hold the proving unit, thus freeing the user's hands.

Although the strap mount portion 144 is shown as being positioned toward the rear sidewall 126 of the housing 118, it should be appreciated that in other implementations a strap mount portion may be positioned on or proximate one or more other surfaces (e.g., left lateral sidewall 128, right lateral sidewall 130) of the housing. Further, the strap mount portion 144 may define an aperture that is shaped, sized and dimensioned in any suitable manner which allows a strap to be secured to the housing 118. Additionally, in at least some implementations, the strap mount portion 144 may be selectively removable from the housing 118. For example, the strap mount portion 144 may include a threaded member, and the housing 118 may include a threaded aperture therein which selectively receives the threaded member to secure the strap mount portion 144 to the housing 118.

Figure 4:
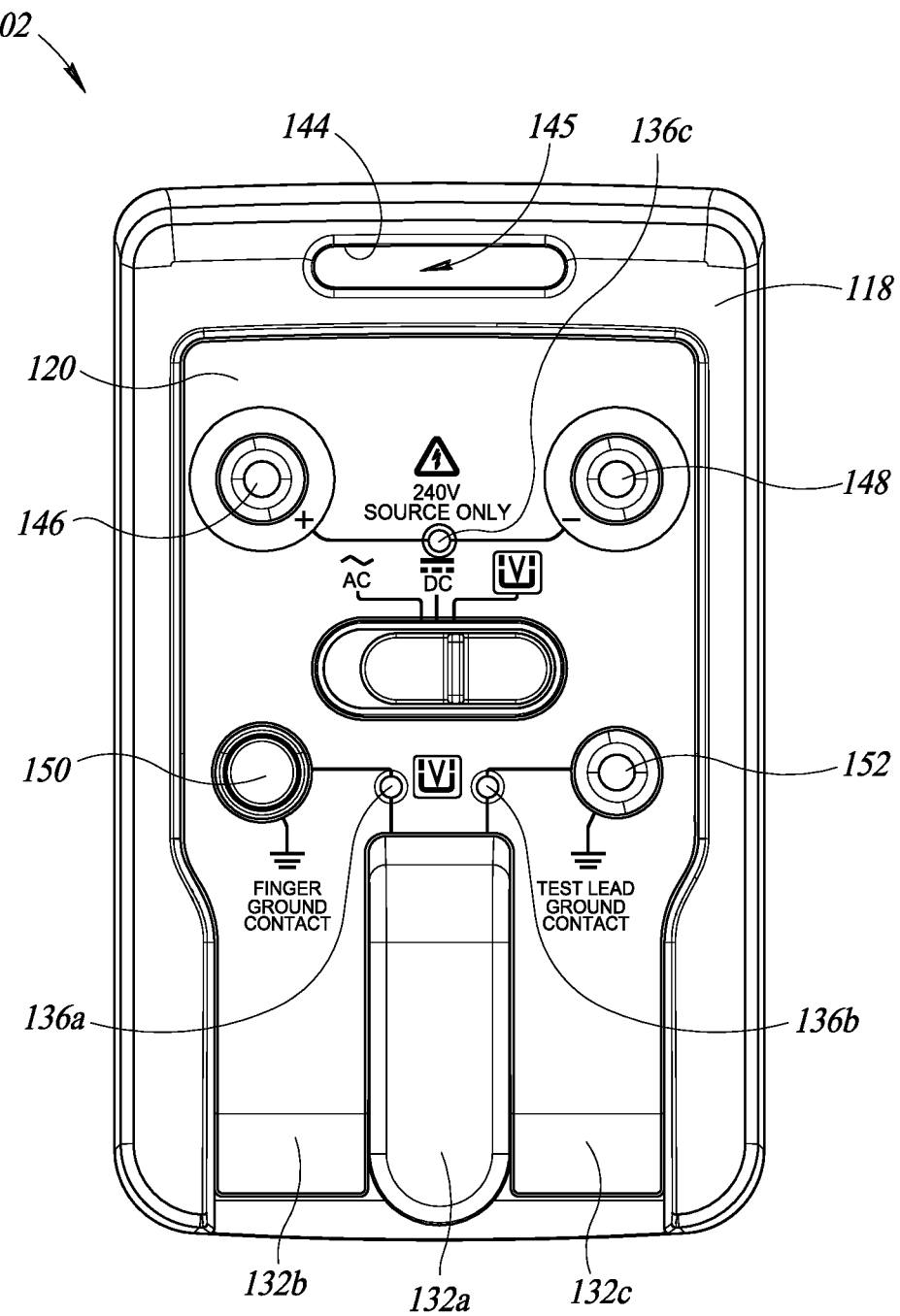
FIG. 4 is a front elevational view of the voltage measurement device proving unit.

As shown best in FIG. 4, the proving unit 102 includes four ports, namely, a contact AC/DC positive probe port 146, a contact AC/DC negative probe port 148, a field sense finger contact port or touch pad 150, and a field sense probe port 152. The contact AC/DC positive probe port 146, the contact AC/DC negative probe port 148, and the field sense probe port 152 may be recessed to minimize unintended contact (e.g., by a finger of the operator).

The contact AC/DC positive probe port 146 is the positive terminal for contact AC/DC voltage output by the proving unit 102. The contact AC/DC negative probe port 148 is the low or negative terminal for AC/DC voltage output by the proving unit. The field sense finger contact port or touch pad 150 and the field sense probe port 152 function as alternative negative or low pole ports that can be used by the operator while proving the operation of a non-contact voltage measurement device. Voltage measurements require two points. In the field sense non-contact mode, one point is the field sense conductor 134 located inside the raised central portion or bump 132a of the sensor receiving portion 132 which receives the fork of the voltage measurement device 104. The second point is either the field sense finger contact port or touch pad 150 or the field sense probe port 152.

In operation, the non-contact voltage measurement device 104 measures the voltage difference between a wire positioned in the recessed portion 116 of the probe end 112 and a reference (e.g., "black") test lead. In normal operation, the non-contact voltage measurement device 104 measures a voltage in a wire (i.e., a first point) with reference to earth (i.e., a second point). The reference test lead of the non-contact voltage measurement device is connected to earth by a metal-to-metal contact with earth or through the operator's body. When using the proving unit 102 to test the non-contact voltage measurement device 104, there is no earth reference. Thus, the proving unit 102 includes the field sense finger contact port 150 and the field sense probe port 152 for a reference. The first point is the field sense conductor 134 and the second point is the field sense finger contact port 150 or the field sense probe port 152.

When an operator intends to prove the operation of a contact voltage measurement device (e.g., conventional DMM), the operator may electrically couple a positive test lead or probe of the voltage measurement device to the contact AC/DC positive probe port 146 and couple a negative test lead or probe to the contact AC/DC negative probe port 148. The operator may position the mode selection switch 138 in a left most position (as shown in FIG. 4) to put the proving unit 102 into a contact AC voltage mode wherein the proving unit outputs an AC voltage across the contact AC/DC positive probe port 146 and the contact AC/DC negative probe port 148. The operator may also position the mode selection switch 138 in a central position (as shown in FIG. 4) to put the proving unit 102 into a contact DC voltage mode wherein the proving unit outputs a DC voltage across the contact AC/DC positive probe port 146 and the contact AC/DC negative probe port 148.

When the operator intends to prove a non-contact voltage measurement device, such as the non-contact voltage measurement device 104 of FIGS. 1A and 1B, the operator may position the mode selection switch 138 in a right most position to put the proving unit 102 into a field sense non-contact AC voltage mode wherein the proving unit outputs an AC voltage in the field sense conductor 134 (FIGS. 2 and 6) positioned inside the central raised portion 132a of the sensor receiving portion 132 of the proving unit 102. The operator may then position the front end 112 of the non-contact voltage measurement device 104 at the sensor receiving portion 132 (see FIG. 1B), and either touch a finger to the field sense finger contact port 150 while grasping the non-contact voltage measurement device or connect a reference probe of the voltage measurement device to the field sense probe port 152.

In at least some implementations, one or more of the ports 146, 148, 150 and 152 includes an "ON switch" that causes the proving unit 102 to turn ON and output a voltage for a determined period of time (e.g., 10 seconds, 30 seconds, 60 seconds, less than 10 seconds, more than 60 seconds, any duration between 10 and 60 seconds, etc.). In the illustrated example, each of the ports 146, 148, and 150 includes a leaf spring 153 (FIG. 6) that contacts a respective ON switch 154 (FIG. 6) that, when pressed by a probe, or the operator's finger for the port 150, causes the proving unit 102 to generate the output voltage selected by the mode selection switch 138 for a determined period of time.

The indicator LEDs 136 indicate when the proving unit 102 is turned ON and is outputting a selected voltage. Specifically, the LED 136b indicates that the proving unit 102 is providing a contact AC/DC voltage output, the LED 136a indicates that the proving unit is providing a non-contact AC voltage output activated by the operator's finger (i.e., finger contacting finger port 150), and the LED 136c indicates that the proving unit is providing a non-contact AC voltage output activated by a probe of a non-contact voltage measurement device connected to the field sense probe port 152. When the LEDs 136 all remain off after one of the ON switches 154 has been activated, such may indicate to the operator that the batteries 142 need to be replaced for proper operation of the proving unit. In at least some implementations, when the batteries 142 are too low for the proving unit 102 to operate, the LEDs 136 may be illuminated briefly for a short period of time (e.g., less than one second) before they are turned off, which signals to the operator that the batteries need to be replaced.

Figure 5:
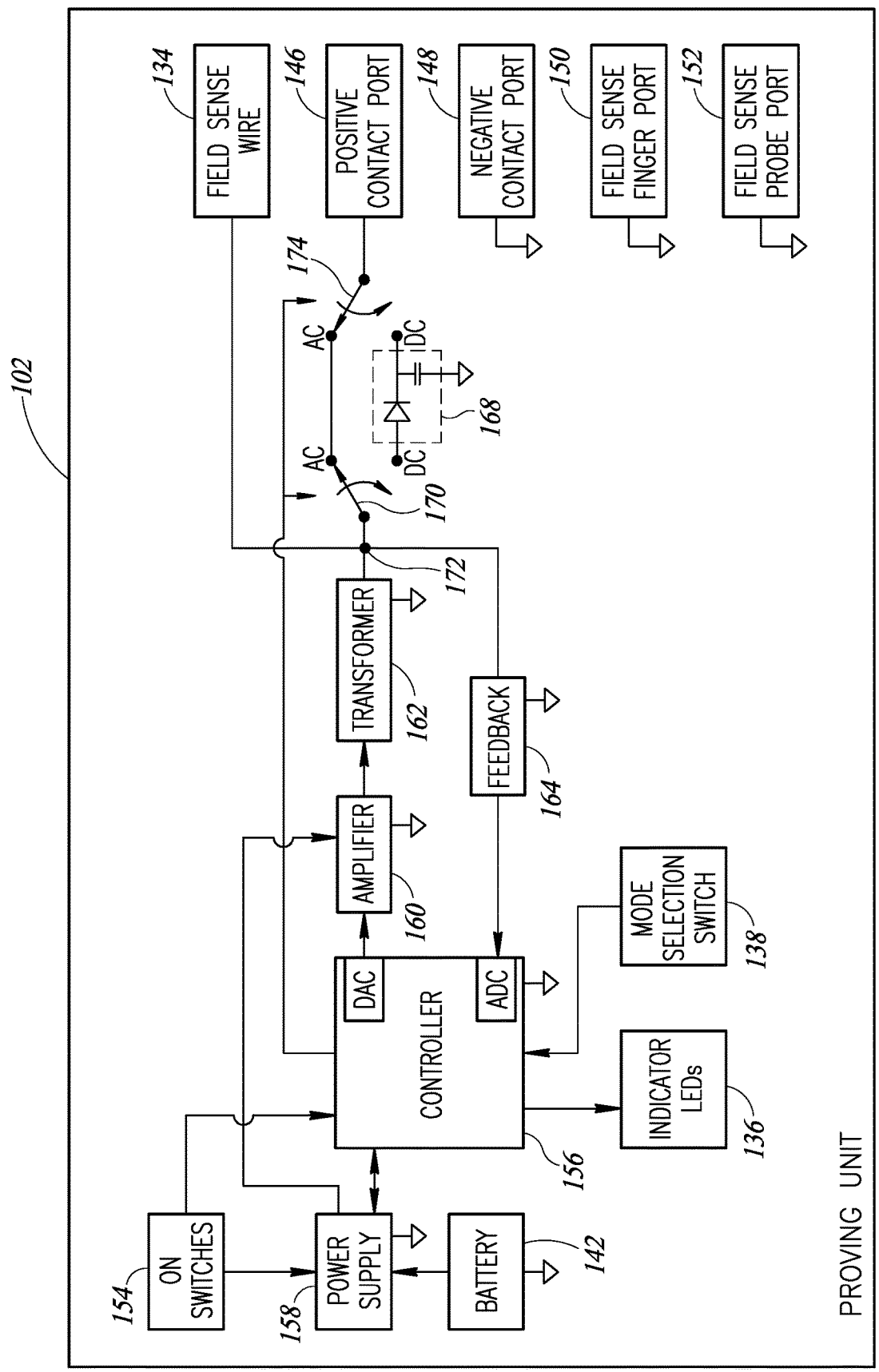
FIG. 5 is a schematic block diagram of the voltage measurement device proving unit, according to one illustrated implementation.

FIG. 5 shows a schematic block diagram of the proving unit 102, showing various example components thereof. The proving unit 102 includes a power supply 158 which may receive power from the one or more batteries 142. Although not shown, the proving unit 102 in some implementations may also optionally include an AC power source subsystem that receives AC power from an AC power source (e.g., AC mains). The one or more batteries 142 may be any suitable rechargeable or non-rechargeable batteries (e.g., alkaline, lithium ion, zinc-carbon, nickel-cadmium, nickel-metal hydride). In at least some implementations, an AC power source subsystem may receive AC power and may generate DC power to recharge the one or more batteries 142 associated with the DC power source subsystem. In such instances, the AC power source subsystem may include an AC-to-DC converter. The one or more batteries 142 may be removable from the housing 118 or, in implementations where rechargeable batteries are utilized, the one or more batteries may be fixed within the housing and charged from time-to-time by connecting the proving unit 102 to a suitable power source, such as an AC source coupled to the AC power source subsystem.

The power supply 158 may include a step up DC-to-DC converter operative to receive DC input from the one or more batteries 142 and to output one or more voltage supplies to other components of the proving unit 102. In at least some implementations, the power supply 158 is operative to output 3.3 VDC to a controller 156 of the proving unit 102, and 12 VDC to an amplifier 160 of the proving unit.

The controller 156 may serve as the computational center of the proving unit 102 by supporting the execution of instructions and reading and writing data to one or more storage devices, I/O interfaces, and communication systems. The storage devices associated with the controller 156 may include one or more forms of non-transitory processor-readable storage media. Nontransitory processor-readable storage media is any currently available or later developed media suitable for storing programs and data accessible by one or more device components, such as a processor of the controller. Non-transitory processor readable storage media may be removable or non-removable and may be volatile or non-volatile. Examples of nontransitory processor-readable storage media may include hard drives as well as RAM, ROM, EEPROM, flash types of memory, etc. As used herein, the term processor is not limited to integrated circuits referred to in the art as a computer, but broadly refers to a microcontroller, a microcomputer, a microprocessor, a programmable logic controller, an application specific integrated circuit, other programmable circuits, combinations of the above, among others. Generally, the controller 156 may include one or more processors, storage devices, buses, I/O interfaces, communications systems, etc., to control the functionality of the proving unit 102.

The controller 156 may be operatively coupled to the indicator LEDs 136 or other user interface. The controller 156 may also be operatively coupled to the mode selection switch 138.

The ON switches 154 (see FIG. 6) may be coupled to the controller 156 and the power supply 158. The ON switches 154 may be operative to power ON the power supply 158 (and other components of the proving unit 102) when any one of the ON switches 154 is activated (e.g., closed) as a result of one of the ports 146, 150, or 152 being pressed by the operator (e.g., by contacting with a probe or finger). The controller 156 may keep track of the ON time and turn OFF the power supply 158 after a determined period of time (e.g., 10 seconds). Thus, the proving unit 102 is normally turned OFF and only turns ON for the determined period of time (e.g., 10 seconds) upon activation of one of the ON switches 154, which ensures the batteries 142 last for an extended duration. The duration of the ON time after one of the ON switches 154 is activated may be fixed or may be user selectable.

When the power supply 158 is turned ON, the controller 156 may utilize a digital-to-analog converter (DAC) to output a sine wave to an amplifier 160 that is powered by the power supply 158. The amplifier 160 boosts the DAC signal from the controller 156 to drive a step up transformer 162, which brings the voltage up to a specified level (e.g., 240

VAC) at an AC output node 172. In at least some implementations, the amplifier may be a class D audio amplifier, for example. The controller 156, amplifier 160 and transformer 162 may collectively be referred to herein as an AC voltage source that is operative to generate the AC voltage at the output node 172.

Feedback circuitry 164 may be electrically coupled to the output node 172. The feedback circuitry 164 may divide down (e.g., via a voltage divider) the AC voltage at the output node 172 to a range that is suitable to be received by an analog-to-digital converter (ADC) of the controller 156. The feedback circuitry 164 may also rectify and filter the divided down AC voltage to provide a stable DC voltage feedback signal. The controller 156 utilizes the received feedback signal to monitor the voltage at the output node 172 and adjust the output of the DAC to maintain the output voltage at a specified level (e.g., 240 VAC).

The output node 172 is coupled to the field sense conductor 134 to provide the AC voltage through the wire for verification of non-contact voltage measurement devices, as discussed above. Additionally, the proving unit 102 includes AC/DC switches 170 and 174 that are controllable by the controller 156. When the proving unit 102 is in an AC voltage mode, the switches 170 and 174 are positioned as shown in FIG. 5, and the output node 172 is directly electrically coupled to the contact AC/DC positive probe port 146, which provides an AC voltage across the contact AC/DC positive probe port 146 and the AC/DC negative probe port 148. When the DC voltage mode is selected by the operator, the switches 170 and 174 electrically couple the output node 172 to AC-to-DC converter circuitry 168, which converts the AC voltage at the output node to a DC voltage across the contact AC/DC positive probe port 146 and the AC/DC negative probe port 148. Thus, the AC/DC switches 170 and 174 act to selectively couple the AC-to-DC circuitry 168 between the AC output node 172 and the contact AC/DC positive probe port 146. In the illustrated implementation, the AC-to-DC converter circuitry 168 includes a rectifying diode and a filter capacitor, but in different implementations other circuitry may be used. The switches 170 and 174 may be referred to herein as a "AC/DC switch" that selectively couples the output node 172 directly to the contact AC/DC positive port 146, or indirectly to the contact AC/DC positive port via the AC-to-DC converter circuitry 168, so that the proving unit 102 is transitioned between an AC voltage mode and a DC voltage mode.

In at least some implementations, the controller 156 may monitor the output node 172 of the transformer 162 to detect when the AC voltage output is not at the specified voltage level. Upon such a determination, the controller 156 may cause an output (e.g., light, display, speaker) to provide a visual, audible and/or haptic indicator to the user that the proving unit 102 is not functioning properly and should not be used to verify the operation of a non-contact voltage measurement device. In the example provided above, the controller 156 may turn OFF all of the indicator LEDs 136 after one of the ON switches 154 is pressed, signaling to the operator that the proving unit is not operating properly (e.g., batteries 142 require replacement). As noted above, in some implementations, when the batteries 142 are too low for the proving unit 102 to operate, the LEDs 136 may be illuminated briefly for a short period of time (e.g., less than one second) before they are turned off, which signals to the operator that the batteries need to be replaced. In other implementations, other types of signaling (e.g., different illumination patterns) may be used to notify the operator that the batteries 142 need to be replaced.

In implementations wherein the proving unit 102 can output a plurality of user- or device-selectable output voltages and/or frequencies, the controller 156 may selectively adjust the DAC output and/or one or more parameters of the amplifier 160 to output a specified voltage level and/or a specified frequency level. The proving unit 102 may utilize any suitable technique to provide multiple different voltage levels and/or frequencies. As an example, the proving unit 102 may include various components that are switched in or out of a circuit dependent on the specified voltage level and/or frequency to be output by the proving unit. As another example, one or more operational parameters may be selectively adjusted dependent on the specified voltage level and/or frequency to be output by the proving unit 102.

In at least some implementations, the proving unit 102 may include a user interface that includes a display, for example, a liquid crystalline display (LCD) device, a light emitting diode (LED) device, and/or an organic light emitting diode (OLED) device. The user interface may include touch screen, which may be any type of touch screen currently known or later developed. For example, the touch screen may be a capacitive, infrared, resistive, or surface acoustic wave (SAW) device.

The user interface of the proving unit 102 may include a single input device or a combination of input devices which communicate an input to the proving unit. The input device(s) may include, for example, buttons, switches, trigger switches, selectors, a rotary switch or other input devices known to those of ordinary skill in the art. The input device(s) may be used to toggle the operational status (e.g., OFF/ON) of the proving unit 102, and/or may be used to select one or more AC voltage output levels (e.g., 100 VAC, 120 VAC, 200 VAC, 240 VAC) and/or one or more AC frequency levels (e.g., 50 Hz, 60 Hz).

In at least some implementations, the proving unit 102 may be provided (e.g., sold) as a kit that includes at least one of a non-contact voltage measurement device or a contact voltage measurement device.

The foregoing detailed description has set forth various implementations of the devices and/or processes via the use of block diagrams, schematics, and examples. Insofar as such block diagrams, schematics, and examples contain one or more functions and/or operations, it will be understood by those skilled in the art that each function and/or operation within such block diagrams, flowcharts, or examples can be implemented, individually and/or collectively, by a wide range of hardware, software, firmware, or virtually any combination thereof. In one implementation, the present subject matter may be implemented via Application Specific Integrated Circuits (ASICs). However, those skilled in the art will recognize that the implementations disclosed herein, in whole or in part, can be equivalently implemented in standard integrated circuits, as one or more computer programs running on one or more computers (e.g., as one or more programs running on one or more computer systems), as one or more programs running on one or more controllers (e.g., microcontrollers) as one or more programs running on one or more processors (e.g., microprocessors), as firmware, or as virtually any combination thereof, and that designing the circuitry and/or writing the code for the software and or firmware would be well within the skill of one of ordinary skill in the art in light of this disclosure.

Those of skill in the art will recognize that many of the methods or algorithms set out herein may employ additional acts, may omit some acts, and/or may execute acts in a different order than specified. As an example, in at least some implementations a voltage measurement device proving unit may not utilize a processor to execute instructions. For example, a voltage measurement device proving unit may be hardwired to provide some or all of the functionality discussed herein. Additionally, in at least some implementations a voltage measurement device proving unit may not utilize a processor to cause or initiate the different functionality discussed herein. For example, such voltage measurement device proving unit may rely on one or more separate inputs, such as a user-actuated button which causes the proving unit to output an AC or DC voltage.

In addition, those skilled in the art will appreciate that the mechanisms taught herein are capable of being distributed as a program product in a variety of forms, and that an illustrative implementation applies equally regardless of the particular type of signal bearing media used to actually carry out the distribution. Examples of signal bearing media include, but are not limited to, the following: recordable type media such as floppy disks, hard disk drives, CD ROMs, digital tape, and computer memory.

The various implementations described above can be combined to provide further implementations. These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure.

The invention claimed is:

1. A proving unit to verify the operation of a separate voltage measurement device, the proving unit comprising:
   a housing;
   an alternating current (AC) voltage source that, in operation, provides an AC voltage at an AC output node;
   a contact AC/DC positive port that is accessible to a test instrument probe of a separate contact voltage measurement device;
   AC-to-DC converter circuitry that, in operation, receives an AC voltage as input and outputs a DC voltage;
   at least one AC/DC switch that, in operation, selectively electrically couples the AC output node of the AC voltage source either directly to the contact AC/DC positive port, or indirectly to the contact AC/DC positive port via the AC-to-DC converter circuitry;
   a field sense conductor disposed within the housing at a sensor receiving portion of the housing, wherein the field sense conductor is electrically coupled to the AC output node;
   a mode selection switch; and
   a controller operatively coupled to the mode selection switch, the AC voltage source, and the at least one AC/DC switch, wherein, in operation, the controller:
      receives, via the mode selection switch, a selection of a mode of operation, the mode of operation comprising at least a DC voltage mode or an AC voltage mode;
      controls the at least one AC/DC switch based at least in part on the received selection of the mode of operation; and
      causes the AC voltage source to provide an AC voltage at the AC output node.

2. The proving unit of claim 1 wherein the sensor receiving portion comprises a central raised portion that contains at least a portion of the field sense conductor, and the central raised portion is sized and dimensioned to receive a probe end of a non-contact voltage measurement device.

3. The proving unit of claim 1 wherein the AC voltage source comprises a digital-to-analog converter, an amplifier, and a transformer, wherein an output of the digital-to-analog converter is coupled to an input of the amplifier, an output of the amplifier is coupled to an input of the transformer, and the AC output node comprises an output of the transformer.

4. The proving unit of claim 1, further comprising an ON switch operatively coupled to the controller, wherein, in operation, the ON switch is activated responsive to an operator interacting with a port of the proving unit, and the controller causes the AC voltage source to provide the AC voltage for a determined period of time after the ON switch is activated.

5. The proving unit of claim 1, further comprising a field sense finger port electrically coupled to a reference node of the proving unit, wherein the field sense finger port is accessible to a finger of an operator of a separate non-contact voltage measurement device that is being verified by the proving unit while the operator is grasping the non-contact voltage measurement device.

6. The proving unit of claim 5, further comprising a plurality of ON switches operatively coupled to the controller, each of the ON switches associated with a different port of the proving unit, wherein, in operation, each of the ON switches is activated responsive to an operator interacting with one of the respective ports of the proving unit, and the controller causes the AC voltage source to provide the AC voltage for a determined period of time after activation of any of the ON switches.

7. The proving unit of claim 1, further comprising:
   a field sense probe port electrically coupled to a reference node of the proving unit, wherein the field sense probe port is accessible to a test instrument probe of a separate non-contact voltage measurement device that is being verified by the proving unit.

8. The proving unit of claim 7, further comprising a plurality of ON switches operatively coupled to the controller, each of the ON switches associated with a different port of the proving unit, wherein, in operation, each of the ON switches is activated responsive to an operator interacting with one of the respective ports of the proving unit, and the controller causes the AC voltage source to provide the AC voltage for a determined period of time after activation of any of the ON switches.

9. The proving unit of claim 1 wherein the at least one AC/DC switch comprises a first AC/DC switch coupled to an input of the AC-to-DC converter circuitry and a second AC/DC switch coupled to an output of the AC-to-DC converter circuitry.

10. The proving unit of claim 1, further comprising an indicator coupled to the controller, wherein, in operation, the controller controls the indicator to provide an indication of an operational status of the proving unit.

11. The proving unit of claim 10 wherein the indicator comprises a plurality of light emitting diodes (LEDs).

12. The proving unit of claim 1, further comprising feedback circuitry operatively coupled to the AC output node and the controller, wherein, in operation, the controller receives a feedback signal from the feedback circuitry and controls the operation of the AC voltage source based at least in part on the received feedback signal.

13. The proving unit of claim 1 wherein the AC-to-DC converter circuitry comprises at least one rectifying diode and at least one filter capacitor.

14. The proving unit of claim 1 wherein, upon receiving a selection of an AC voltage mode, the controller controls the at least one AC/DC switch to electrically couple the AC output node of the AC voltage source directly to the contact AC/DC positive port and, upon receiving a selection of a DC voltage mode, the controller controls the at least one AC/DC switch to electrically couple the AC output node of the AC voltage source indirectly to the contact AC/DC positive port via the AC-to-DC converter circuitry.

15. A proving unit to verify the operation of a separate voltage measurement device, the proving unit comprising:
an alternating current (AC) voltage source that, in operation, provides an AC voltage at an AC output node;
a contact AC/DC positive port;
AC-to-DC converter circuitry that, in operation, receives an AC voltage as input and outputs a DC voltage;
at least one AC/DC switch that, in operation, selectively electrically couples the AC-to-DC converter circuitry between the AC output node and the contact AC/DC positive port;
a field sense conductor electrically coupled to the AC output node;
a mode selection switch; and
control circuitry operatively coupled to the mode selection switch, the AC voltage source, and the at least one AC/DC switch, wherein, in operation, the control circuitry:
receives, via the mode selection switch, a selection of a mode of operation, the mode of operation comprising at least a DC voltage mode or an AC voltage mode;
controls the at least one AC/DC switch based at least in part on the received selection of a mode of operation; and
causes the AC voltage source to provide an AC voltage at the AC output node.

16. The proving unit of claim 15 wherein the control circuitry causes the AC voltage source to provide an AC voltage at the AC output node for a period of time after user interaction with a port of the proving unit is detected.

17. The proving unit of claim 16 wherein the period of time is between 10 seconds and 60 seconds.

18. The proving unit of claim 15 wherein the AC voltage source comprises a digital-to-analog converter, an amplifier, and a transformer, wherein an output of the digital-to-analog converter is coupled to an input of the amplifier, an output of the amplifier is coupled to an input of the transformer, and the AC output node comprises an output of the transformer.

19. The proving unit of claim 15, further comprising:
a field sense finger port electrically coupled to a reference node of the proving unit, wherein the field sense finger port is accessible to a finger of an operator of a separate non-contact voltage measurement device while grasping the non-contact voltage measurement device; and
a field sense probe port electrically coupled to a reference node of the proving unit, wherein the field sense probe port is accessible to a test instrument probe of a separate non-contact voltage measurement device.

20. The proving unit of claim 15, further comprising an indicator coupled to the control circuitry, wherein, in operation, the control circuitry controls the indicator to provide an indication of an operational status of the proving unit.

21. A kit, comprising:
a voltage measurement device; and
a proving unit to verify the operation of the voltage measurement device, the proving unit comprising:
a housing;
an alternating current (AC) voltage source that, in operation, provides an AC voltage at an AC output node;
a contact AC/DC positive port that is accessible to a test instrument probe of a separate contact voltage measurement device;
AC-to-DC converter circuitry that, in operation, receives an AC voltage as input and outputs a DC voltage;
at least one AC/DC switch that, in operation, selectively electrically couples the AC output node of the AC voltage source either directly to the contact AC/DC positive port, or indirectly to the contact AC/DC positive port via the AC-to-DC converter circuitry;
a field sense conductor disposed within the housing at a sensor receiving portion of the housing, the sensor receiving portion configured and arranged to receive at least a portion of the voltage measurement device, the field sense conductor electrically coupled to the AC output node;
a mode selection switch; and
a controller operatively coupled to the mode selection switch, the AC voltage source, and the at least one AC/DC switch, wherein, in operation, the controller:
receives, via the mode selection switch, a selection of a mode of operation, the mode of operation comprising at least a DC voltage mode or an AC voltage mode;
controls the at least one AC/DC switch based at least in part on the received selection of the mode of operation; and
causes the AC voltage source to provide an AC voltage at the AC output node.

22. The kit of claim 21, wherein the voltage measurement device comprises at least one of a contact voltage measurement device or a non-contact voltage measurement device capable of measuring voltage in an insulated wire without galvanically contacting a conductor in the insulated wire.

* * * * *